US009082859B2

(12) United States Patent
Hwang et al.

(10) Patent No.: US 9,082,859 B2
(45) Date of Patent: Jul. 14, 2015

(54) THIN FILM TRANSISTOR AND FLAT DISPLAY DEVICE

(75) Inventors: Won-Mi Hwang, Yongin (KR); Young-Bae Jung, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 1027 days.

(21) Appl. No.: 13/067,610

(22) Filed: Jun. 14, 2011

(65) Prior Publication Data

US 2012/0161134 A1   Jun. 28, 2012

(30) Foreign Application Priority Data

Dec. 24, 2010   (KR) .......................... 10-2010-0134883

(51) Int. Cl.
*H01L 29/04* (2006.01)
*H01L 29/786* (2006.01)
*H01L 27/12* (2006.01)

(52) U.S. Cl.
CPC ........ *H01L 29/7869* (2013.01); *H01L 27/1225* (2013.01)

(58) Field of Classification Search
CPC ........................... H01L 29/786; H01L 29/7869
USPC ................................................ 257/43, 57, 59
See application file for complete search history.

(56) References Cited

U.S. PATENT DOCUMENTS

| 2008/0099764 A1* | 5/2008 | Choi et al. ...................... 257/59 |
| 2008/0176364 A1* | 7/2008 | Yang et al. ..................... 438/151 |
| 2008/0197350 A1 | 8/2008 | Park et al. |
| 2009/0141203 A1 | 6/2009 | Son et al. |

FOREIGN PATENT DOCUMENTS

| KR | 10-2002-0088104 A | 11/2002 |
| KR | 10-2007-0100031 A | 10/2007 |
| KR | 10-2008-0076608 A | 8/2008 |
| KR | 10-2009-0057689 A | 8/2008 |
| KR | 10-2008-0095956 A | 10/2008 |
| KR | 10-2009-0056696 A | 6/2009 |

* cited by examiner

*Primary Examiner* — Tran Tran
(74) *Attorney, Agent, or Firm* — Lee & Morse, P.C.

(57) ABSTRACT

A thin film transistor (TFT) includes a scan line on a substrate, the scan line including a straight portion extending along a first direction, an active layer including an oxide semiconductor and overlapping the straight portion of the scan line, the active layer having a first region, a second region, and a third region that are linearly and sequentially aligned along the first direction, a first insulating layer between the active layer and the scan line, a first electrode connected to the first region of the active layer, and a second electrode connected to the third region of the active layer.

18 Claims, 2 Drawing Sheets

THIN FILM TRANSISTOR AND FLAT DISPLAY DEVICE

CROSS-REFERENCE TO RELATED PATENT APPLICATION

This application claims the benefit of Korean Patent Application No. 10-2010-0134883, filed on Dec. 24, 2010, in the Korean Intellectual Property Office, the disclosure of which is incorporated herein in its entirety by reference.

BACKGROUND

1. Field

Example embodiments relate to a thin film transistor (TFT) and a to flat display device including the same. More particularly, example embodiments relate to an oxide TFT and a flat display device including the TFT.

2. Description of the Related Art

Thin film transistors (TFTs) are variously used as switching elements or driving elements of pixels in flat display devices, e.g., organic light-emitting display devices and liquid crystal display devices. For example, an oxide semiconductor that does not require a crystallization process, is in an amorphous state, and has excellent uniformity may be used to form an active layer of a TFT.

SUMMARY

According to an aspect of the example embodiments, there is provided a TFT. The TFT may include a scan line on a substrate, the scan line including a straight portion extending along a first direction, an active layer including an oxide semiconductor and overlapping the straight portion of the scan line, the active layer having a first region, a second region, and a third region that are linearly and sequentially aligned along the first direction, a first insulating layer between the active layer and the scan line, a first electrode connected to the first region of the active layer, and a second electrode connected to the third region of the active layer.

The scan line, the first insulating layer, and the active layer may be sequentially stacked on the substrate, the first insulating layer covering the scan line.

The active layer may be between the insulating layer and each of the first and second electrodes.

A width of the active layer in a second direction may be almost the same as a width of the first or second electrode, the second direction being substantially perpendicular to the first direction.

A width of the active layer in a second direction may be larger than a width of the straight portion of the scan line, the second direction being substantially perpendicular to the first direction.

A width of the active layer in a second direction may be substantially the same as a width of the straight portion of the scan line, the second direction being substantially perpendicular to the first direction.

The active layer may include indium tin oxide (ITO) or indium zinc oxide (IZO).

According to another aspect of the example embodiments, there is provided a flat display device. The flat display device may include a TFT, the TFT including a scan line on a substrate, the scan line including a straight portion extending along a first direction, an active layer including an oxide semiconductor and overlapping the straight portion of the scan line, the active layer having a first region, a second region, and a third region that are linearly and sequentially aligned along the first direction, a first insulating layer between the active layer and the scan line, a first electrode connected to the first region of the active layer, and a second electrode connected to the third region of the active layer, a first capacitor electrode on the substrate, a second capacitor electrode connected to the second electrode, the second capacitor electrode being insulated from the first, capacitor electrode, and a pixel electrode connected to the second electrode of the TFT and to the second capacitor electrode.

The second capacitor electrode may be integral with the pixel electrode, the second capacitor electrode and pixel electrode including a same material.

The first capacitor electrode and the scan line may be at a same height with respect to the substrate and may include a same material.

The scan line, the first insulating layer, and the active layer may be sequentially stacked on the substrate, the first insulating layer covering the scan line.

The active layer may be between the insulating layer and each of the first and second electrodes.

A width of the active layer in a second direction may be almost the same as a width of the first or second electrode, the second direction being substantially perpendicular to the first direction.

A width of the active layer in a second direction may be larger than a width of the straight portion of the scan line, the second direction being substantially perpendicular to the first direction.

A width of the active layer in a second direction may be substantially the same as a width of the straight portion of the scan line, the second direction being substantially perpendicular to the first direction.

The active layer may include indium tin oxide (ITO) or indium zinc oxide (IZO).

BRIEF DESCRIPTION OF THE DRAWINGS

The above and other features and advantages of the example embodiments will become more apparent by describing in detail exemplary embodiments thereof with reference to the attached drawings in which.

DETAILED DESCRIPTION

Hereinafter, example embodiments will be described in detail with reference to the attached drawings.

Figure 1:
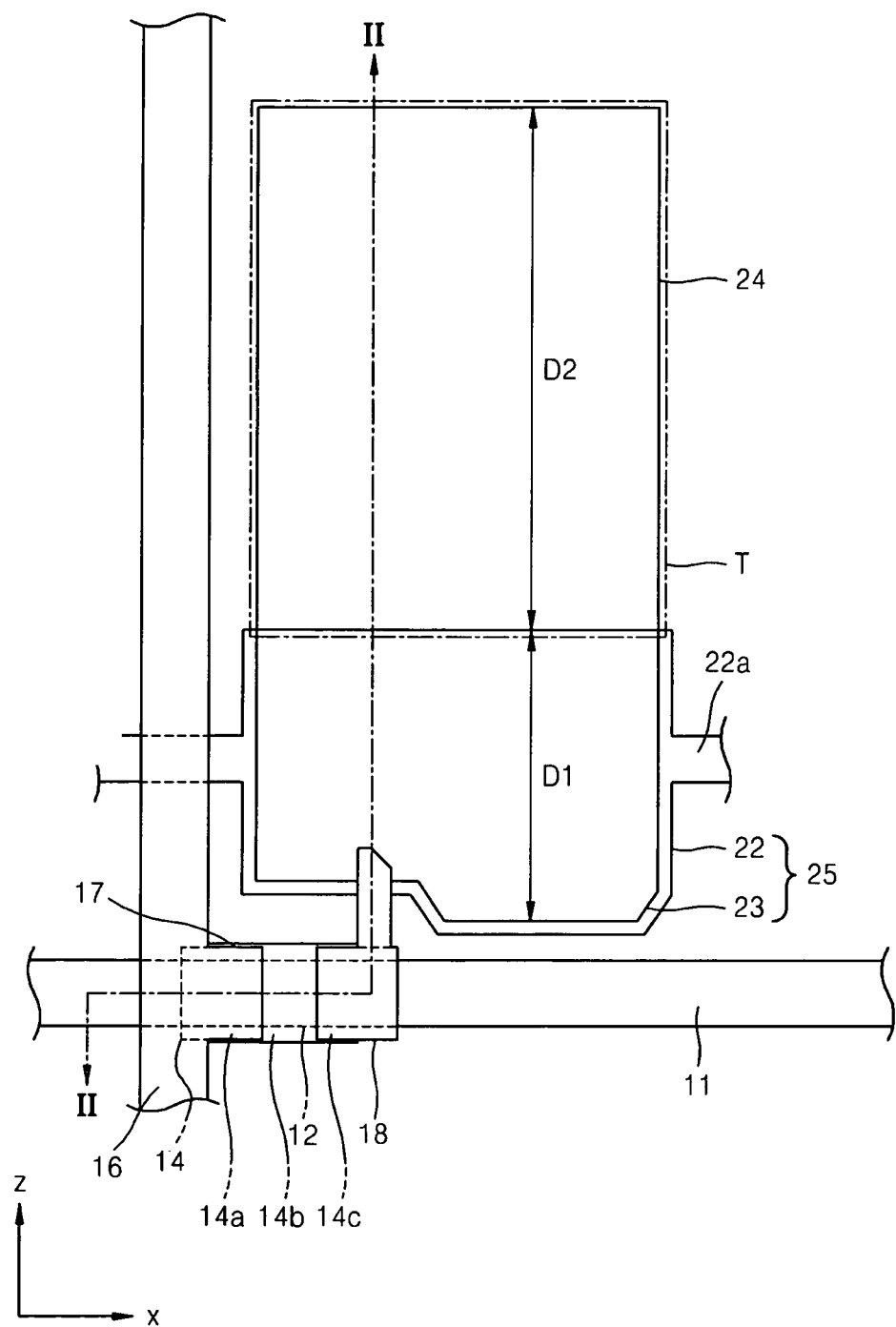
FIG. 1 is a plan view of one pixel of a flat display device according to an embodiment.
Figure 2:
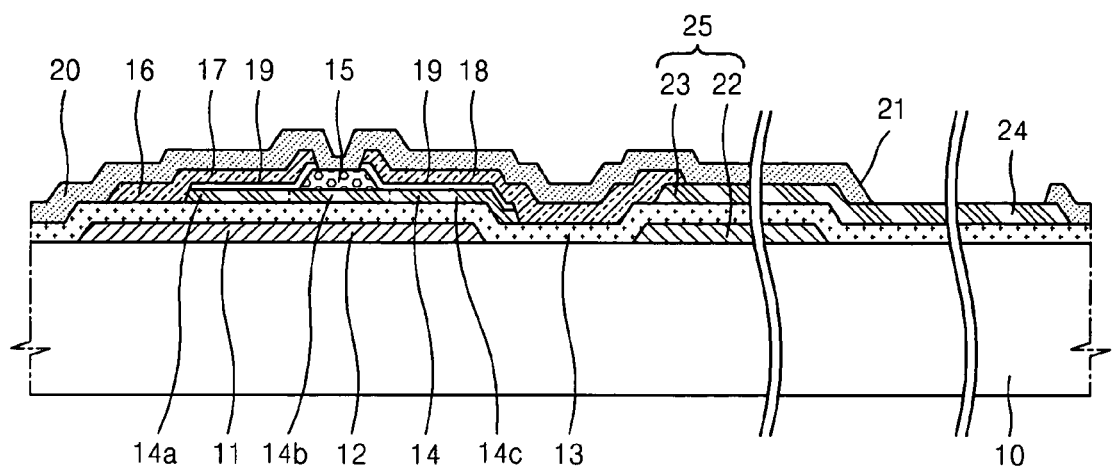
FIG. 2 is a cross-sectional view cut along line II-II of FIG. 1.

FIG. 1 is a plan view of one pixel of a flat display device according to an embodiment. FIG. 2 is a cross-sectional view along line II-II of FIG. 1. It is noted that the flat display device in FIGS. 1-2 is a liquid crystal display device. However, the liquid crystal display is an example and embodiments are not limited thereto, e.g., the flat display device may be an organic light-emitting display device.

Referring to FIGS. 1 and 2, a scan line 11 extends on a substrate 10 in one direction. The scan line 11 includes at least a straight portion 12 that straightly extends, e.g., the straight portion 12 extends linearly along the x-axis. For example, as illustrated in FIG. 1, the scan line 11 extends in a horizontal direction, e.g., along the x-axis, and the straight portion 12 straightly, i.e., linearly, extends in the direction in which the scan line 11 extends. It is noted that even if the scan line 11 is not linear, e.g., when the scan line 11 includes a bent portion, at least a portion of the scan line 11 may be linear. That is, if the scan line 11 is not linear, the scan line 11 may still include the straight portion 12 that extends linearly in one direction. The straight portion 12 of the scan line 11 functions as a gate electrode.

A first insulating layer 13 is formed to cover, e.g., completely overlap, the scan line 11. The first insulating layer 13 may be formed of an organic insulator, e.g., acrylic, or an inorganic insulator, e.g., silicon (Si) oxide, tantalum (Ta) oxide, or aluminum (Al) oxide.

An active layer 14 is formed on the first insulating layer 13 by using an oxide semiconductor. As illustrated in FIG. 1, the active layer 14 may have a rectangular shape that extends in the horizontal direction. The active layer 14 includes a first region 14a, a second region 14b, and a third region 14c that are straightly, i.e., linearly, and sequentially aligned. In this case, a virtual line for connecting centers of the first through third regions 14a through 14c extends in parallel with the straight portion 12, e.g., along the x-axis. The first region 14a is a source region, the second region 14b is a channel region, and the third region 14c is a drain region.

The active layer 14 may be formed of a transparent oxide material. For example, the active layer 14 may be, e.g., a G-I-Z-O layer [an $(In_2O_3)a(Ga_2O_3)b(ZnO)c$ layer], where a, b, and c are real numbers that satisfy $a \geq 0$, $b \geq 0$, and $c > 0$). In another example, the active layer 14 may be formed of indium zinc oxide (IZO) or indium tin oxide (ITO) having a low photo leakage current.

A width of the active region 14 along a vertical direction, e.g., along the z-axis in FIG. 1, may be substantially constant, and may be larger than a width of the straight portion 12, i.e., wider than the gate electrode, along the vertical direction. As such, overlapping areas between the straight portion 12 of the scan line 11 and the first and second electrodes 17 and 18 may be reduced, thereby reducing parasitic capacitances.

An etching stopper 15 is formed on the second region 14b, i.e., on the channel region, a first electrode 17 is formed on the first region 14a, and a second electrode 18 is formed on the third region 14c. The active layer 14 is connected to the first and second electrodes 17 and 18. A width of each of the first and second electrodes 17 and 18 along the z-axis may substantially equal the width of the active layer 14 along the z-axis, e.g., the active layer 14 and each of the first and second electrode 17 and 18 may overlap, e.g., completely overlap, each other.

A portion of the first electrode 17 and a portion of the second electrode 18 extend to the etching stopper 15, and an ohmic contact layer 19 may be further formed between the active layer 14 and each of the first electrode 17 and the second electrode 18. That is, the ohmic contact layer 19 is formed under the first and second electrodes 17 and 18. The first electrode 17 is connected to a data line 16.

As such, a thin film transistor (TFT) is formed on the substrate 10, with the active layer 14 between the straight portion 12, i.e., the gate electrode, and the first/second electrodes 17/18. A second insulating layer 20 is formed to cover the TFT. The second insulating layer 20 may be formed of an organic insulator, e.g., acrylic, or an inorganic insulator, e.g., Si oxide, Ta oxide, or Al oxide.

A capacitor 25 is further formed on the substrate 10. A first capacitor electrode 22 is formed on the substrate 10 by using the same material and at the same level as the scan line 11, i.e., height level with respect to an upper surface of the substrate 10. The first capacitor electrode 22 is connected to a capacitor line 22a.

A second capacitor electrode 23 connected to the second electrode 18 is formed on the first insulating layer 13, such that the first insulating layer 13 is between the first and second capacitor electrodes 22 and 23. The first and second capacitor electrodes 22 and 23 with the first insulating layer 13 therebetween define the capacitor 25.

The second capacitor electrode 23 is connected to and may be formed integrally with a pixel electrode 24. The pixel electrode 24 may be formed of transparent conductive oxide through which light from a backlight unit may be transmitted, e.g., indium oxide (InO), ITO, IZO, or zinc oxide (ZnO). Accordingly, the pixel electrode 24 may be formed simultaneously with and of the same material as the second capacitor electrode 23 and the active layer 14.

The second capacitor electrode 23 may be covered by the second insulating layer 20, and an opening 21 may be formed in the second insulating layer 20 to correspond to the pixel electrode 24. In other words, a portion of the second insulating layer 20 may be removed to expose the pixel electrode 24.

As described above, according to example embodiments, since the active layer 14 is formed of a transparent oxide, e.g., IZO or ITO, having a low photo leakage current, the width of the straight portion 12 may be smaller than the width of the active layer 14 in a direction perpendicular to the virtual line for connecting the centers of the first through third regions 14a through 14c. As such, overlapping areas and parasitic capacitances may be reduced between the straight portion 12 of the scan line 11 and the first and second electrodes 17 and 18. Consequently, an area of the capacitor 25 may be reduced (FIG. 1), i.e., a width D1 along the z-axis may be reduced, and an area of a transmission region T formed by the pixel electrode 24 may be increased, i.e., a width D2 along the z-axis may be increased, by the reduced area of the capacitor 25, i.e., by the difference between D1 and D2. Therefore, an aperture ratio of a pixel may be increased.

In addition, since the straight portion 12 of the scan line 11 overlaps the entire active layer 14, i.e., the first through third regions 14a through 14c, in a lengthwise direction, i.e., along the x-axis, an area of a gate block may be minimized. Therefore, an aperture ratio of a pixel may be increased further.

Since an aperture ratio of a pixel is increased as described above, the flat display device according to example embodiments may exhibit improved image quality characteristics and reduced power consumption of a backlight unit. Therefore, a number of light-emitting diodes (LEDs) used in the backlight unit may be reduced.

Figure 3:
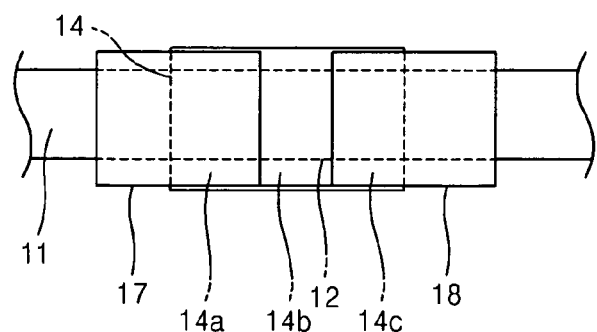
FIG. 3 is a plan view of a thin film transistor (TFT) in a flat display device according to another embodiment.

It is noted that although a total length of a longitudinal side of the active layer 14, i.e., a length along the x-axis, is sufficiently large to correspond to, i.e., overlap completely, the first and second electrodes 17 and 18 (FIG. 1), embodiments are not limited thereto. For example, a total length of the active layer 14, i.e., a sum of lengths of the regions 14a through 14c along the x-axis, may be smaller than a distance along the x-axis between outermost edges of the first and second electrodes 17 and 18, so the active layer 14 may overlap only portions of the first and second electrodes 17 and 18 (FIG. 3). In this case (referring to FIG. 3), the first and second electrodes 17 and 18 also contact a side surface of the active layer 14, thereby improving characteristics between the active layer 14 and each of the first and second electrodes 17 and 18.

Figure 4:
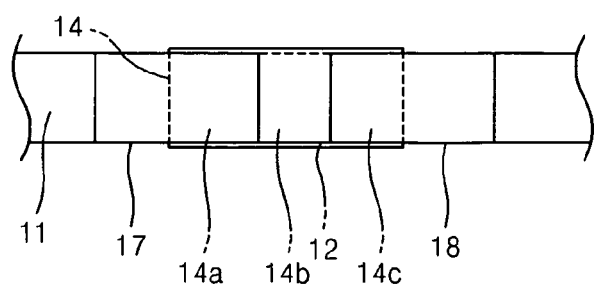
FIG. 4 is a plan view of a TFT in a flat display device according to another embodiment.

FIG. 4 is a plan view of a TFT according to another embodiment. In FIG. 4, a width of the active layer 14 along the vertical direction, i.e., along the z-axis, is almost the same as the width of the straight portion 12 of the scan line 11 along the vertical direction. In this case, since the active layer 14 is covered by the straight portion 12, transmission of light from a backlight unit to the active layer 14 may be prevented, thereby eliminating or substantially minimizing a photo leakage current.

It is noted that although the width of the active layer 14 in the vertical direction is slightly greater than the width of the straight portion 12 of the scan line 11 in FIGS. 3 and 4, the illustration is provided to identify each element for convenience of explanation, and the width of the active layer 14 may rather be the same as or slightly less than the width of the straight portion 12.

According to the example embodiments, since an active layer is formed of ITO or IZO, a width of a straight portion of a scan line may be smaller than a width of the active layer in a direction perpendicular to a longitudinal direction of the active layer. Therefore, overlapping areas and parasitic capacitances between the straight portion of the scan line and each of the first and second electrodes may be reduced. Consequently, an area of a capacitor may be reduced, and an area of a transmission region formed by a pixel electrode may be increased by the reduced area of the capacitor. Thus, an aperture ratio of a pixel may be increased.

In addition, since the whole straight portion of the scan line overlaps the active layer, i.e., first through third regions, along the longitudinal direction, an area of a gate block may be minimized, thereby providing a TFT capable of increasing an aperture ratio of pixels.

Further, since an aperture ratio of a pixel is improved as described above, image quality characteristics may be improved and power consumption of a backlight unit may be reduced. Thus, a number of LEDs used in the backlight unit may be reduced.

In contrast, when a conventional liquid crystal display device includes a TFT with a gate block for blocking light emitted from a backlight unit, i.e., since a photo leakage current occurs when an oxide semiconductor is exposed to external light, an area of the gate electrode may be increased to block the emitted light. Therefore, an aperture ratio of a pixel may be reduced by the increased area of the gate electrode, thereby complicating a process of achieving high definition.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:

1. A thin film transistor (TFT), comprising:
   a scan line on a substrate, the scan line including a straight portion extending along a first direction;
   an active layer including an oxide semiconductor and overlapping the straight portion of the scan line, the active layer having a first region, a second region, and a third region that are linearly and sequentially aligned along the first direction;
   a first insulating layer between the active layer and the scan line;
   a first electrode connected to the first region of the active layer; and
   a second electrode connected to the third region of the active layer,
   wherein a width of the active layer in a second direction is larger than a width of the straight portion of the scan line in the second direction, the second direction being substantially perpendicular to the first direction, and
   wherein the straight portion of the scan line extends along and overlaps an entire length of the active layer along the first direction, and the first and second electrodes are separate electrodes.

2. The TFT of claim 1, wherein the scan line, the first insulating layer, and the active layer are sequentially stacked on the substrate, the first insulating layer covering the scan line.

3. The TFT of claim 2, wherein the active layer is between the insulating layer and each of the first and second electrodes.

4. The TFT of claim 1, wherein a width of the active layer in a second direction is almost the same as a width of the first or second electrode in the second direction, the second direction being substantially perpendicular to the first direction.

5. The TFT of claim 1, wherein a width of the active layer in a second direction is substantially the same as a width of the straight portion of the scan line in the second direction, the second direction being substantially perpendicular to the first direction.

6. The TFT of claim 1, wherein the active layer includes indium tin oxide (ITO) or indium zinc oxide (IZO).

7. A flat display device, comprising:
   a thin film transistor (TFT), the TFT including:
      a scan line on a substrate, the scan line including a straight portion extending along a first direction,
      an active layer including an oxide semiconductor and overlapping the straight portion of the scan line, the active layer having a first region, a second region, and a third region that are linearly and sequentially aligned along the first direction,
      a first insulating layer between the active layer and the scan line,
      a first electrode connected to the first region of the active layer, and
      a second electrode connected to the third region of the active layer;
   a first capacitor electrode on the substrate;
   a second capacitor electrode connected to the second electrode of the TFT, the second capacitor electrode being insulated from the first capacitor electrode; and
   a pixel electrode connected to the second electrode of the TFT and to the second capacitor electrode.

8. The flat display device of claim 7, wherein the second capacitor electrode is integral with the pixel electrode, the second capacitor electrode and pixel electrode including a same material.

9. The flat display device of claim 7, wherein the first capacitor electrode and the scan line are at a same height with respect to the substrate and include a same material.

10. The flat display device of claim 7, wherein the scan line, the first insulating layer, and the active layer are sequentially stacked on the substrate, the first insulating layer covering the scan line.

11. The flat display device of claim 10, wherein the active layer is between the insulating layer and each of the first and second electrodes.

12. The flat display device of claim 7, wherein a width of the active layer in a second direction is almost the same as a width of the first or second electrode, the second direction being substantially perpendicular to the first direction.

13. The flat display device of claim 7, wherein a width of the active layer in a second direction is larger than a width of the straight portion of the scan line, the second direction being substantially perpendicular to the first direction.

14. The flat display device of claim 12, wherein a width of the active layer in a second direction is substantially the same as a width of the straight portion of the scan line, the second direction being substantially perpendicular to the first direction.

15. The flat display device of claim 7, wherein the active layer includes indium tin oxide (ITO) or indium zinc oxide (IZO).

16. The flat display device of claim 7, wherein the first capacitor electrode is a single layer.

17. The flat display device of claim 7, wherein the second capacitor electrode and the pixel electrode contact each other to define a single layer, the second electrode of the TFT extending along the first insulating layer to directly contact an upper surface of the second capacitor electrode.

18. The TFT of claim 1, wherein the first electrode is connected only to the first region of the active layer, and the second electrode is connected only to the third region of the active layer, the first and third regions of the active layer being at opposite sides of the active layer along the first direction and being completely separated from each other by a channel region.

\* \* \* \* \*